United States Patent
Reznikov et al.

(10) Patent No.: US 6,798,650 B2
(45) Date of Patent: Sep. 28, 2004

(54) DISK DRIVE BRACKET

(75) Inventors: Naum Reznikov, Fremont, CA (US); Michael F. McCormick, Jr., San Jose, CA (US); Ehsan Ettehadieh, Berkeley, CA (US); Daniel Hruska, San Carlos, CA (US); Anthony N. Eberhardt, Los Gatos, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 455 days.

(21) Appl. No.: 10/021,409

(22) Filed: Dec. 12, 2001

(65) Prior Publication Data

US 2002/0050552 A1 May 2, 2002

Related U.S. Application Data

(60) Continuation of application No. 09/490,851, filed on Jan. 24, 2000, which is a division of application No. 08/905,464, filed on Aug. 4, 1997, now Pat. No. 6,067,225.

(51) Int. Cl.[7] .................................................. G06F 1/16
(52) U.S. Cl. .................... 361/685; 312/223.1; D14/363; 439/928.1
(58) Field of Search ......................... 361/685, 724–727; 312/223.1, 223.2; 439/928.1; 360/137 D, 900; D14/363, 432

(56) References Cited

U.S. PATENT DOCUMENTS

| | | | |
|---|---|---|---|
| 3,193,342 A | | 7/1965 | Sauter |
| 3,899,794 A | * | 8/1975 | Brown, Jr. ................... 360/133 |
| 4,941,841 A | * | 7/1990 | Darden et al. ............... 361/685 |
| 5,172,520 A | | 12/1992 | Hostetler et al. |
| 5,222,897 A | | 6/1993 | Collins et al. |
| 5,229,919 A | | 7/1993 | Chen |
| 5,332,306 A | | 7/1994 | Babb et al. |
| 5,442,513 A | | 8/1995 | Lo |
| 5,483,419 A | | 1/1996 | Kaczeus, Sr. et al. |
| 5,557,499 A | | 9/1996 | Reiter et al. |
| 5,563,767 A | | 10/1996 | Chen |
| 5,653,518 A | | 8/1997 | Hardt |
| 5,654,873 A | | 8/1997 | Smithson et al. |
| 5,673,172 A | | 9/1997 | Hastings et al. |
| 5,734,557 A | | 3/1998 | McAnally et al. |
| 5,765,933 A | * | 6/1998 | Paul et al. ................ 312/322.1 |
| 6,067,225 A | | 5/2000 | Reznikov et al. |
| 6,193,339 B1 | | 2/2001 | Behl et al. |

* cited by examiner

Primary Examiner—Lisa Lea-Edmonds
(74) Attorney, Agent, or Firm—Robert C. Kowert; Meyertons, Hood, Kivlin, Kowert & Goetzel, P.C.

(57) ABSTRACT

A bracket having two parallel sides and an interconnecting crosspiece is attached to a disk drive or similar peripheral with the sides of the bracket extending longitudinally of the sides of the drive and the crosspiece extending across the front of the drive. A chassis of a computer or the like has internal parallel sides formed with horizontal guides to receive the bracket, a substantially open front face and an internal connector engageable with a mating connector on the rear of the drive when the bracket is fully inserted in the chassis. The sides of the bracket have features to protect the drive from horizontal and vertical vibrations. A handle is pivoted to the crosspiece near one end moveable between at least three positions: a first or latched position parallel to the crosspiece, a second position swinging out at about a 15° angle and a third position at about a 45° angle. In second position a first point on the end of the handle engages the front edge of the side and a second point is about to enter a slot in one side of the chassis. As the handle is pivoted toward third position the second point engages a margin of the slot and pulls the two connectors apart. To reinsert the drive, the positions of the handle are reversed. A spring biased latch engages a hook on the handle. A second spring opens the unlatched handle from the first to second positions.

72 Claims, 9 Drawing Sheets

DISK DRIVE BRACKET

This application is a continuation of U.S. Ser. No. 09/490,851, filed Jan. 24, 2000 which is divisional of U.S. Ser. No. 08/905,464, field Aug. 4, 1997, now U.S. Pat. No. 6,067,225.

BACKGROUND OF THE INVENTION

1. Field of the Invention

This invention relates to a new and improved disk drive bracket. More particularly, the invention relates to a bracket which is attached to a disk drive and is used in inserting and removing the disk drive from quideways formed in the chassis of a computer or related equipment.

2. Description of the Related Art

Brackets attached to disk drives for purposes similar to the purpose of the present invention are common. The present invention, however, has considerable advantages over prior brackets, as hereinafter explained.

SUMMARY OF THE INVENTION

The present invention comprises a U-shaped bracket, the sides of which are attached to the sides of a disk drive or similar equipment. The sides are provided with means to reduce vibration once the drive is installed in the chassis.

A handle is pivoted to the cross piece of the bracket and is held in closed position by a hook attached to the handle fitting into an opening in the crosspiece to latch behind a detent on a spring-biased slide. By moving the slide laterally, the detent disengages from the hook and a spring causes the handle to pivot outwardly.

When the disk drive with bracket attached is to be inserted in the guideways, the handle is open as the bracket is pushed inwardly until stops thereon engage the chassis. At this point the conventional plug on the inner end of the disk drive is not in engagement with the socket fixed to the chassis. As the handle is swung to closed position, hooks on the handle engage a slot in the side of the chassis to pull the disk drive plug into engagement with the chassis socket in a positive, gradual movement.

When thus installed, the disk drive is locked in place. When it is necessary to remove the disk drive, the user pushes the slide laterally. This releases the handle to swing outwardly to a first open position with protrusions on the handle engaging the chassis to prevent overmovement of the handle. At this point the electrical contact between the disk drive and the chassis socket is intact.

The next step in disengagement of the disk drive from the chassis is for the user to swing the handle further outwardly to a second position. This causes a hook on an extension of the handle to engage a flange in the side of the chassis and positively push the drive bracket and disk drive outwardly to disengage the plug from the socket. Thereafter the user may pull the disk drive out of the guideways and may use the handle to carry the disk drive, if desired.

Accordingly the present invention guides and regulates movement of the disk drive in insertion and removal from guideways in the chassis. More particularly, the present invention causes the socket and plug of the chassis and drive to engage and disengage gradually so that they are unlikely to engage and disengage improperly or to break the pins on the plug. Furthermore electrical contact is disengaged slowly so that sparks or other undesirable effects are reduced or eliminated.

Another feature of the invention is the fact that the bracket and disk drive lock into the chassis more reliably and there is very little likelihood that the drive will spring open.

A further feature of the bracket is that it reduces vibration of the disk drive when the chassis is subjected to vibration or shock. Further, the screws which hold the bracket onto the disk drive make electrical contact therewith and also with metallic springs on the exterior of the bracket which engage the chassis.

Still another feature of the invention is the reduction in space occupied by the bracket as compared with previous structures.

BRIEF DESCRIPTION OF THE DRAWINGS

The accompanying drawings, which are incorporated in and form a part of this specification, illustrate embodiments of the invention and, together with the description serve to explain the principles of the invention.

DESCRIPTION OF THE PREFERRED EMBODIMENTS

Figure 1:
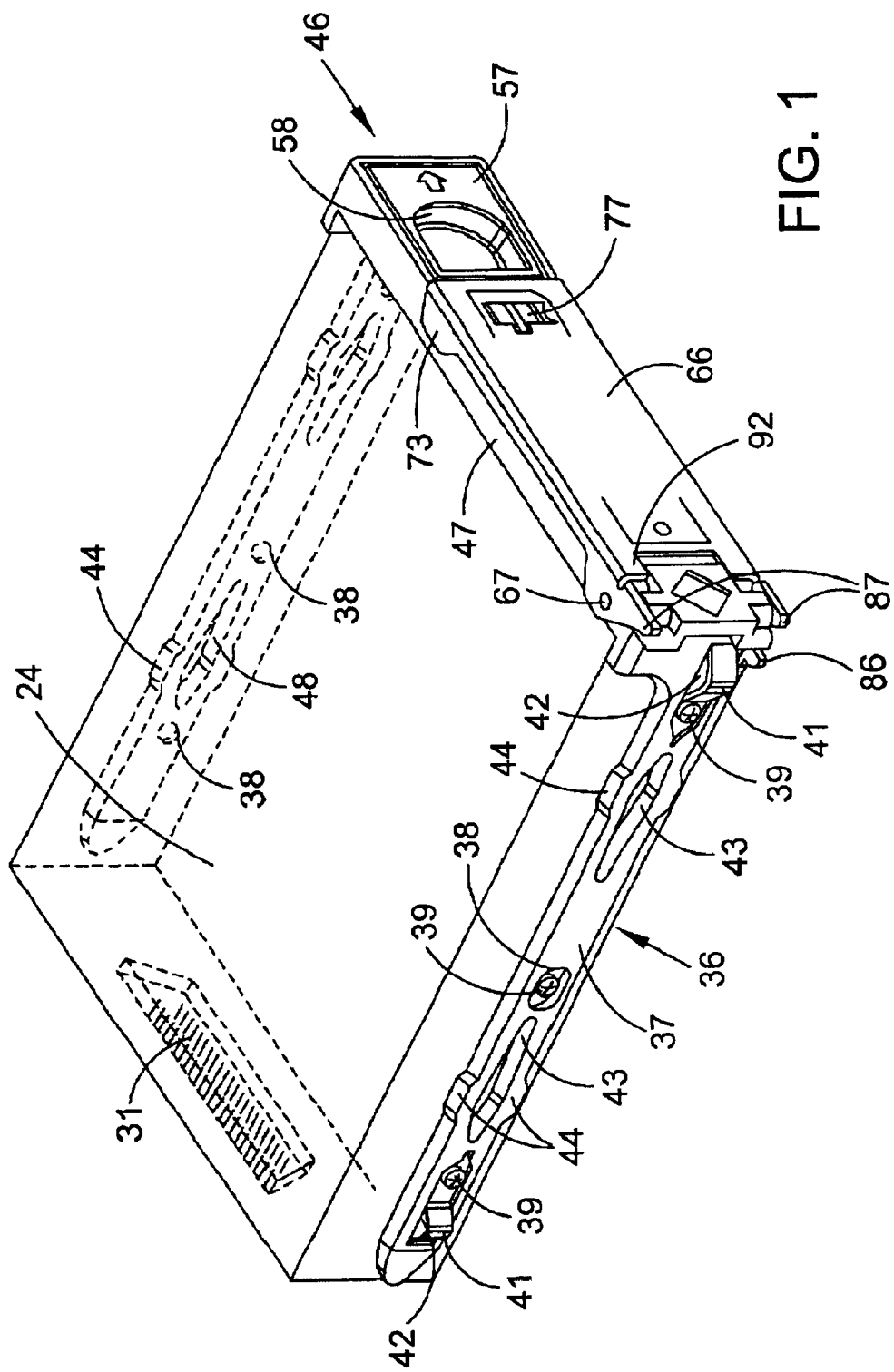
FIG. 1 is a perspective view of a bracket in accordance with the present invention mounted on a disk drive, which is shown schematically.
Figure 2:
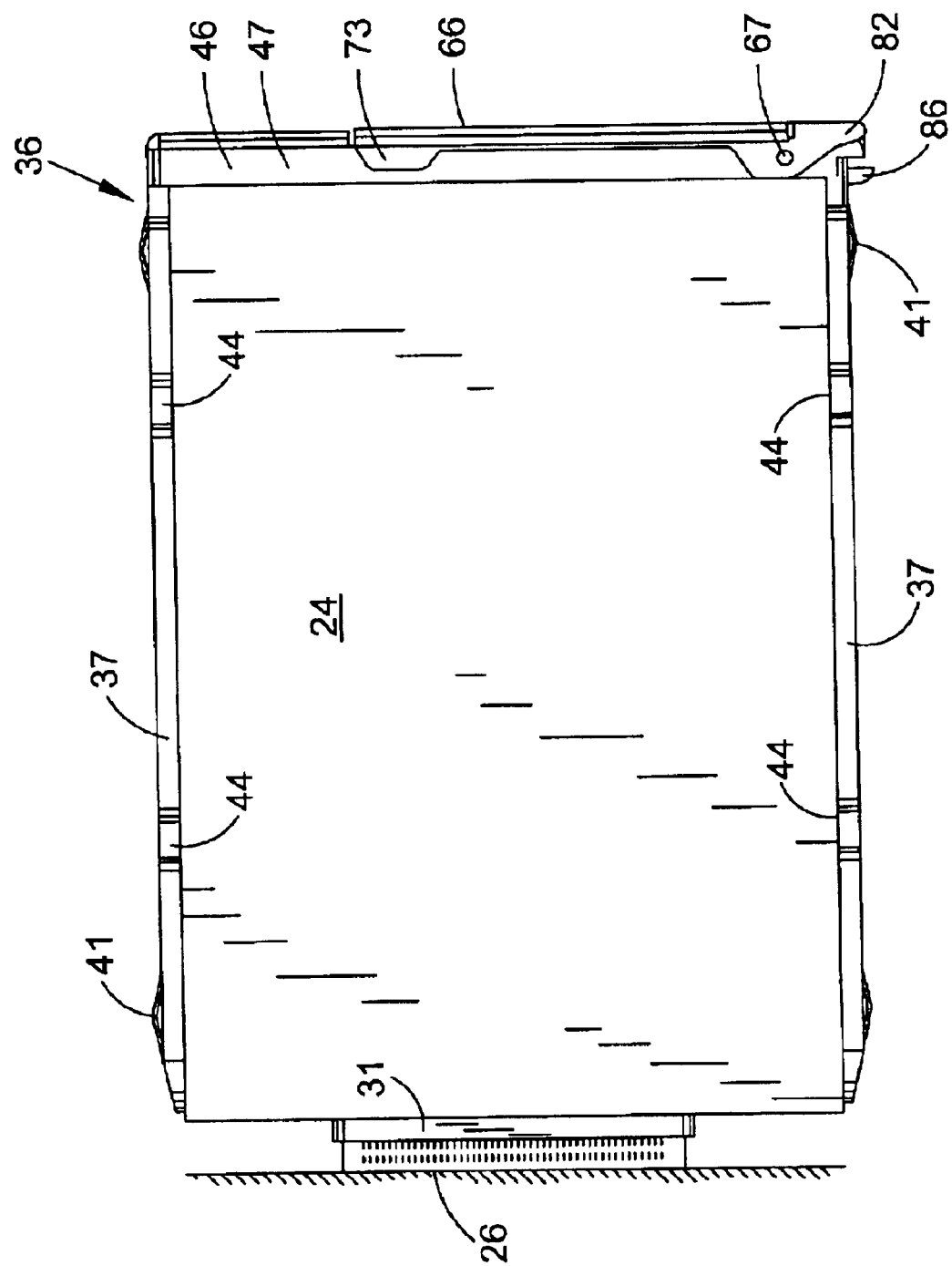
FIG. 2 is a top plan view of the structure of FIG. 1.
Figure 3:
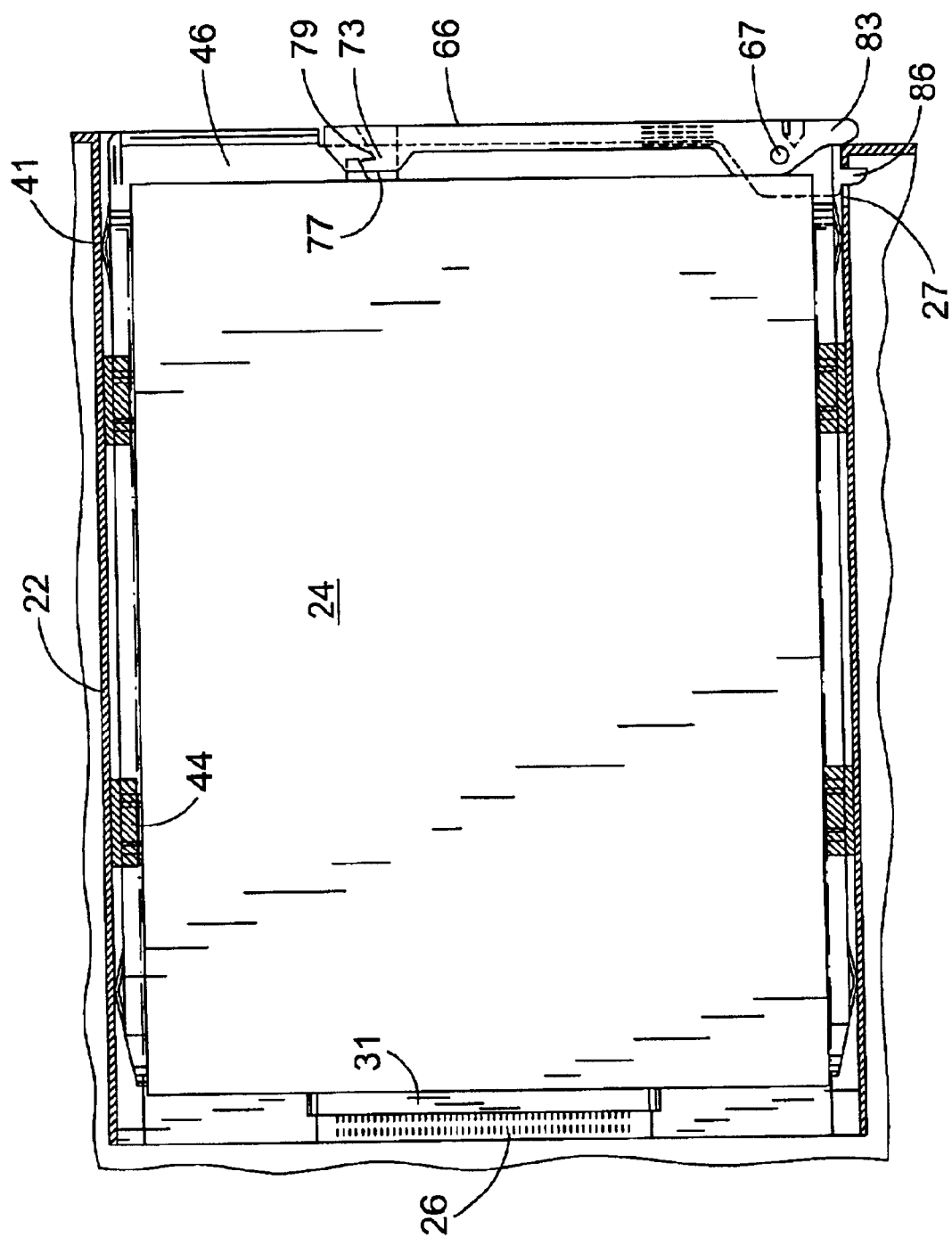
FIG. 3 is a view similar to FIG. 2 showing the bracket and drive installed in guideways in a computer.
Figure 4:
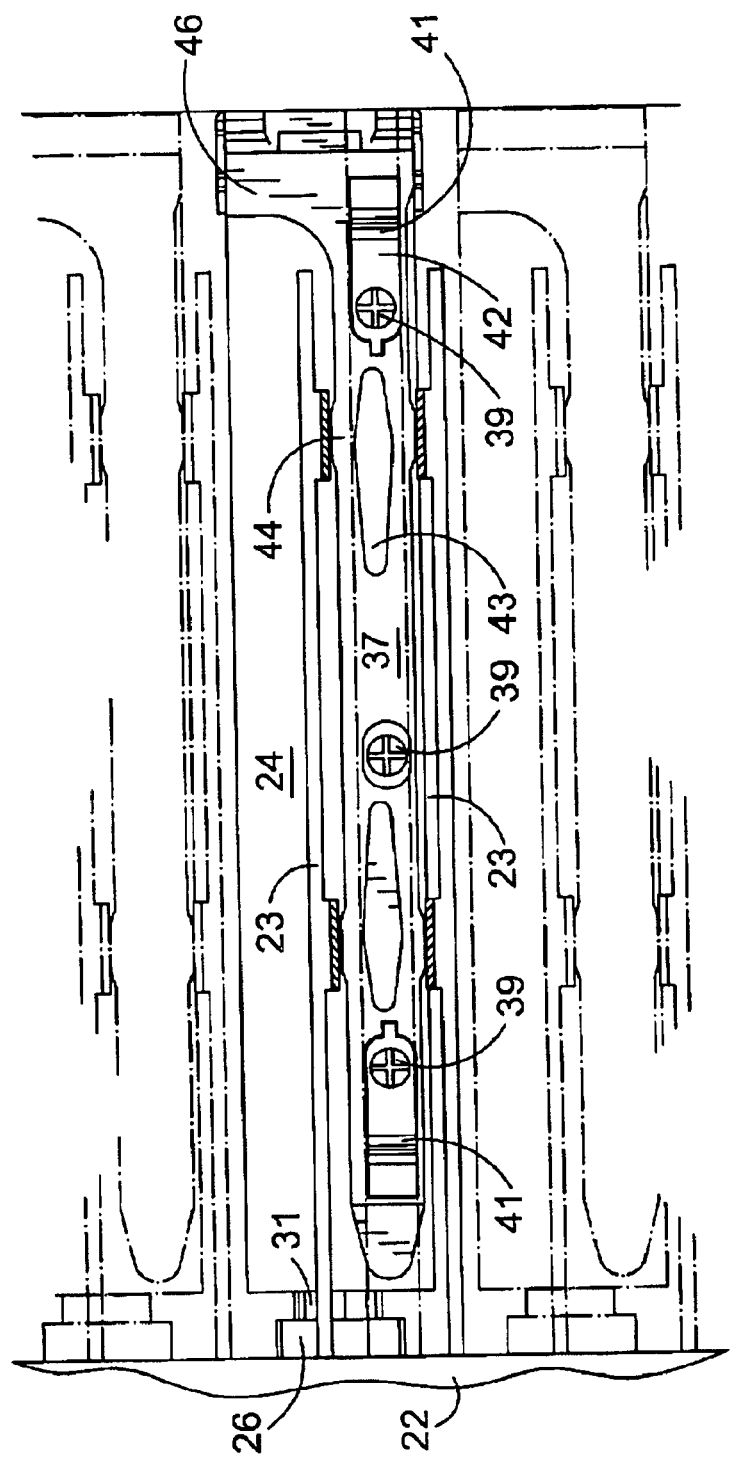
FIG. 4 is a schematic side elevational view showing the bracket and drive installed in guideways in a computer.
Figure 5:
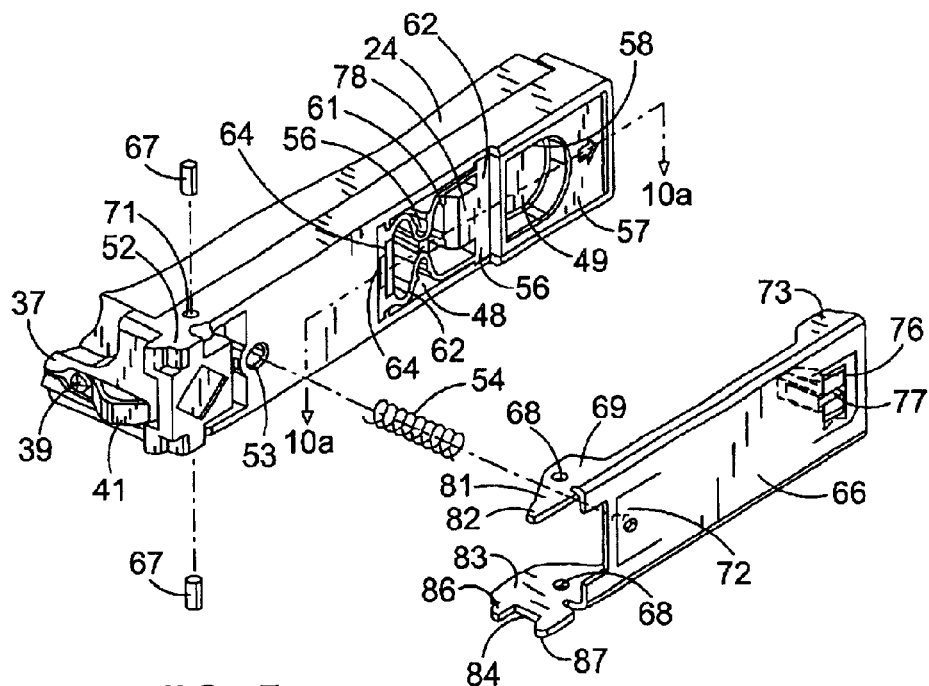
FIG. 5 is an exploded perspective view of the crosspiece of the bracket and its handle.
Figure 10A:
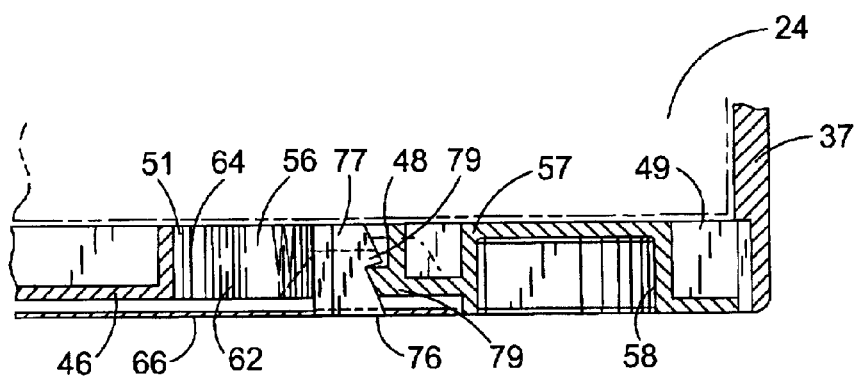
FIG. 10A is a fragmentary sectional view taken substantially along the line 10—10 of FIG. 5 showing the parts assembled and the handle closed.
Figure 10B:
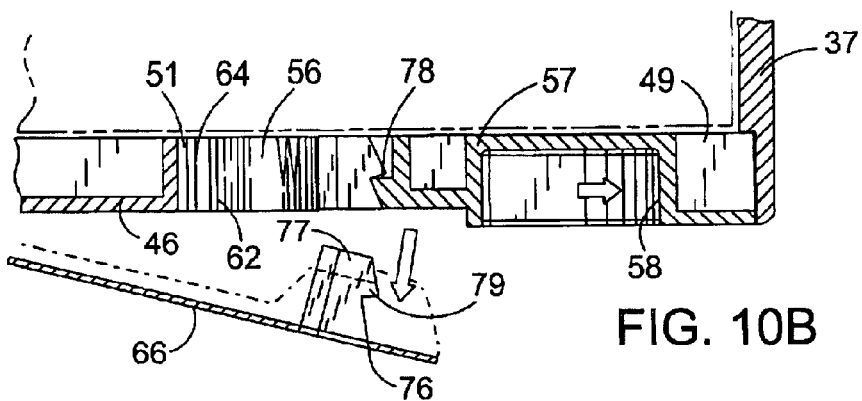
FIG. 10B is a view similar to FIG. 10A showing the handle partly open.

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

A computer or other electronic device is provided with a chassis 21 formed with parallel sides 22, usually of sheet metal, and fabricated so as to provide spaced guides 23 or trackways for a disk drive 24 or other removable component. It will be understood that a plurality of disk drives 24 are frequently installed in the chassis 21, the number, size and spacing thereof being subject to considerable variation. At the back of the chassis is a plurality of stationary sockets 26, each of which may be removably electrically connected to a disk drive 24 installed in a trackway 23 of the chassis. It will be noted that along one edge of at least one of the sides 22 is a slot 27. Functional equivalents of slot 27 will readily occur to one skilled in the art. The front edge 28 of side 22 is shown as a flange.

Disk drive 24 is also subject to considerable variation, and it will be understood that other components besides a disk drive may be used with the present invention. The components of the disk drive are not herein described since such components form no part of the present invention. A plug 31 is provided at the rear of drive 24 to engage socket 26.

A U-shaped bracket 36 in accordance with the present invention is applied across the front and along both sides of the disk drive 24. Sides 37 of bracket 36 are formed with holes 38 for passage of screws 39 to make electrical and mechanical contact with the sides of the disk drive 24. Spring clips 41 formed of metal and curved in shape are held at the front and back end of each side 37 by screws 39 passing through holes 38. Preferable the spring clips 41 are positioned in recesses 42 formed in sides 37. Between holes 38, the sides are formed with splits 43, the portions of the sides 37 above and below the splits 43 being formed with outward bulges 44. The splits 43 and the bulges 44 form a plastic spring which bias the top and bottom bulges 44 outwardly to resiliently engage the bottom and top guides 23 of the chassis 21. Similarly, the spring clips 41 engage the sides of the chassis in resilient fashion. Hence, vibration of the disk drive within the chassis is damped both vertically and horizontally. The metal clips 41 and metal screws 39 establish electrical contact between the sides 22 of the chassis and the disk drive 24.

Crosspiece 46 integrally interconnected the forward ends of the sides 37, and has an upward extension 47 so that the front profile of the crosspiece 46 is substantially that of the front of the disk drive 24. An opening 48 is formed to one side of the center of crosspiece 46, and the front of the crosspiece 46 to the right of the opening 48 is formed with recess 49. A narrow, vertical second recess 51 is formed to the left of the opening 48 so that there is a retainer-defining portion. At the left end of crosspiece 46 there are outward extensions or stops 52 which project outwardly beyond the adjacent side 37. Adjacent the left end of crosspiece 46 is a socket 53 for a coil spring 54, hereinafter described.

Latch spring 56 fits into recesses 49, 51, and extends across opening 48 in crosspiece 46. Spring 56 may be made of many different materials. A presently preferred material is Cycoloy C2950 HF sold by GE Plastics. Latch spring 56 has a slide 57 shaped to slide horizontally in the recess 49 and is itself formed with a recess 58 for insertion of a finger of the user in order to slide the latch spring 56 to the right.

Extending to the left of slide 57 are upper and lower curved spring portions 61, 62 which are integral with the slide 57. Each spring portion 61, 62 is formed with one inward curve and an outward curve, there being a slight space 63 between the innermost curved portions of the upper and lower springs. The left ends of the springs are joined to an integral vertical connector 64 which fits into the recess 51. The parts of the latch spring are so dimensioned as to snap into recesses 49 and 51 and be held therein.

Handle 66 is pivoted to crosspiece 46 by means of pins 67 which fit through holes 68 in left side enlargements 69 of the handle 66, and likewise fit into blind holes 71 in crosspiece 46. A retainer 72 on the inside of handle 66 fits into the end of coil spring 54 to hold the spring in place. Flanges 73 on the right end of handle 66 extend rearward to fit over the top and bottom of crosspiece 46 to hold handle 66 in alignment with spring 56 when closed. Adjacent the right end of handle 66 is an opening 76. A hook 77 fits through the opening 76 and has a barb 78 on its right-hand end. Hence, when the handle 66 is closed against the force of spring 54, the hook 77 enters the space 63 between the inward-curved portions of spring portions 61, 62 and protrusion 79. The barb 78 engages behind the protrusion 79 of hook 77 and holds the handle closed. When the user pushes the slide 57 or detent to the right, the latch spring portions 61, 62 are stressed, releasing hook 77 and allowing the handle 66 under the influence of coil spring 54 to swing outward. To limit outward swinging of handle 66, a notch 91 is formed in crosspiece 46 adjacent the left end thereof. Edge 92 of handle 66 enters notch 91 when the handle 66 is full open (see FIG. 6A) and thereby limits outward movement to about 45°.

Figure 7A:
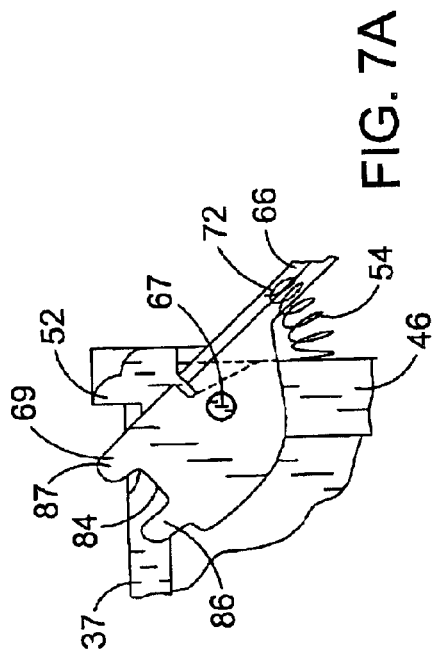
FIG. 7A is a fragmentary bottom plan view of a portion of the handle and bracket.
Figure 7B:
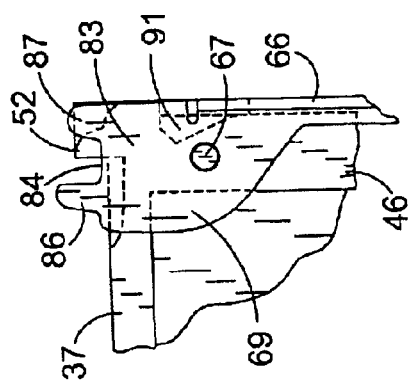
FIG. 7B is a view similar to FIG. 7A showing the handle closed.

Top enlargement 69 of the left side of handle 66 has a protrusion 81 which terminates in a rounded point 82 which is substantially in the same position as stop 52. The bottom protrusion 83 is formed with a notch 84, one finger 86 of the protrusion extending out beyond stop 52 (see FIG. 7B). Rounded point 87 on bottom protrusion 83 corresponds to and moves with rounded point 82.

Operation

Figure 6A:
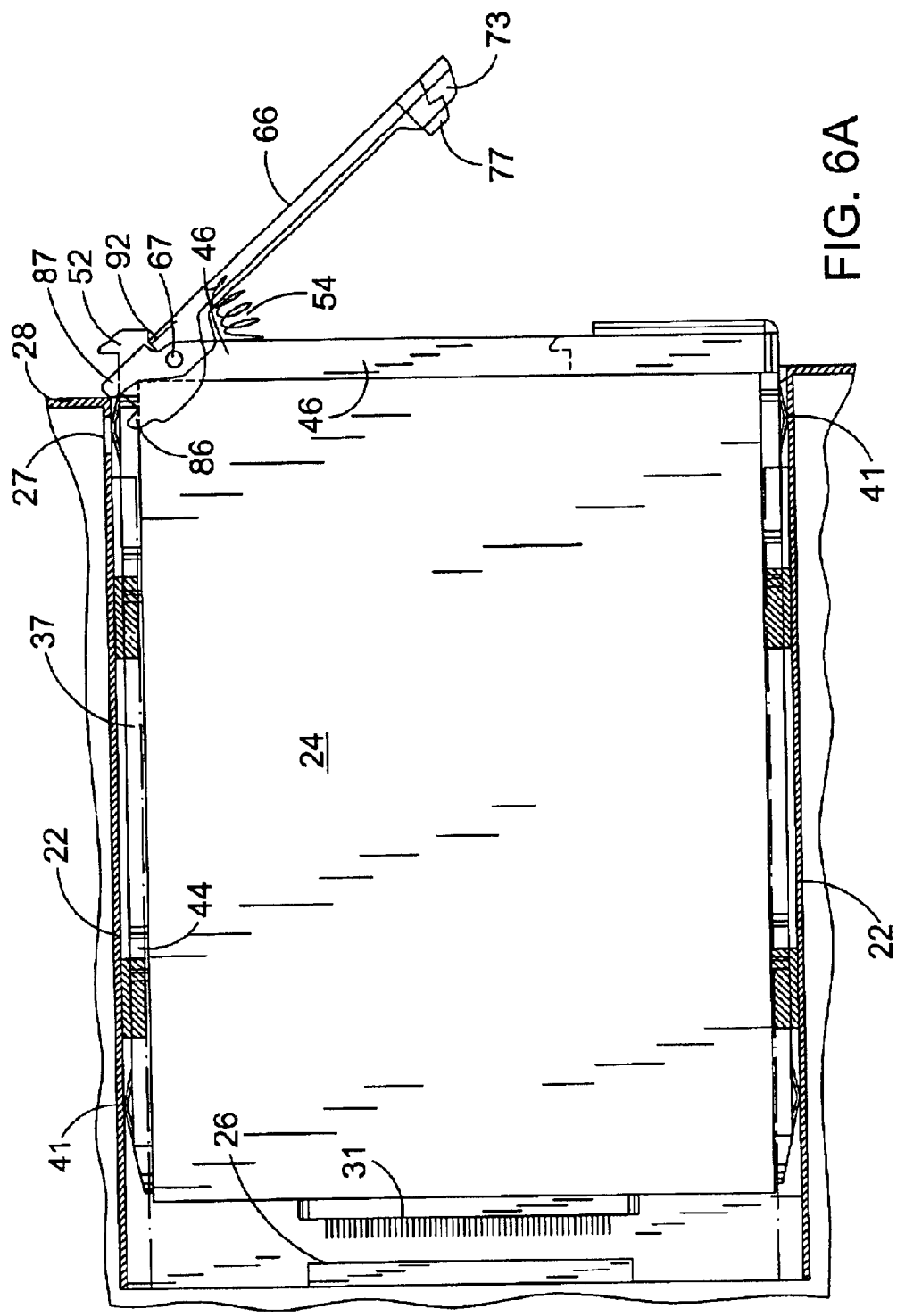
FIGS. 6A through 6C are bottom plan views showing sequential steps in insertion of the drive and bracket.
Figure 6B:
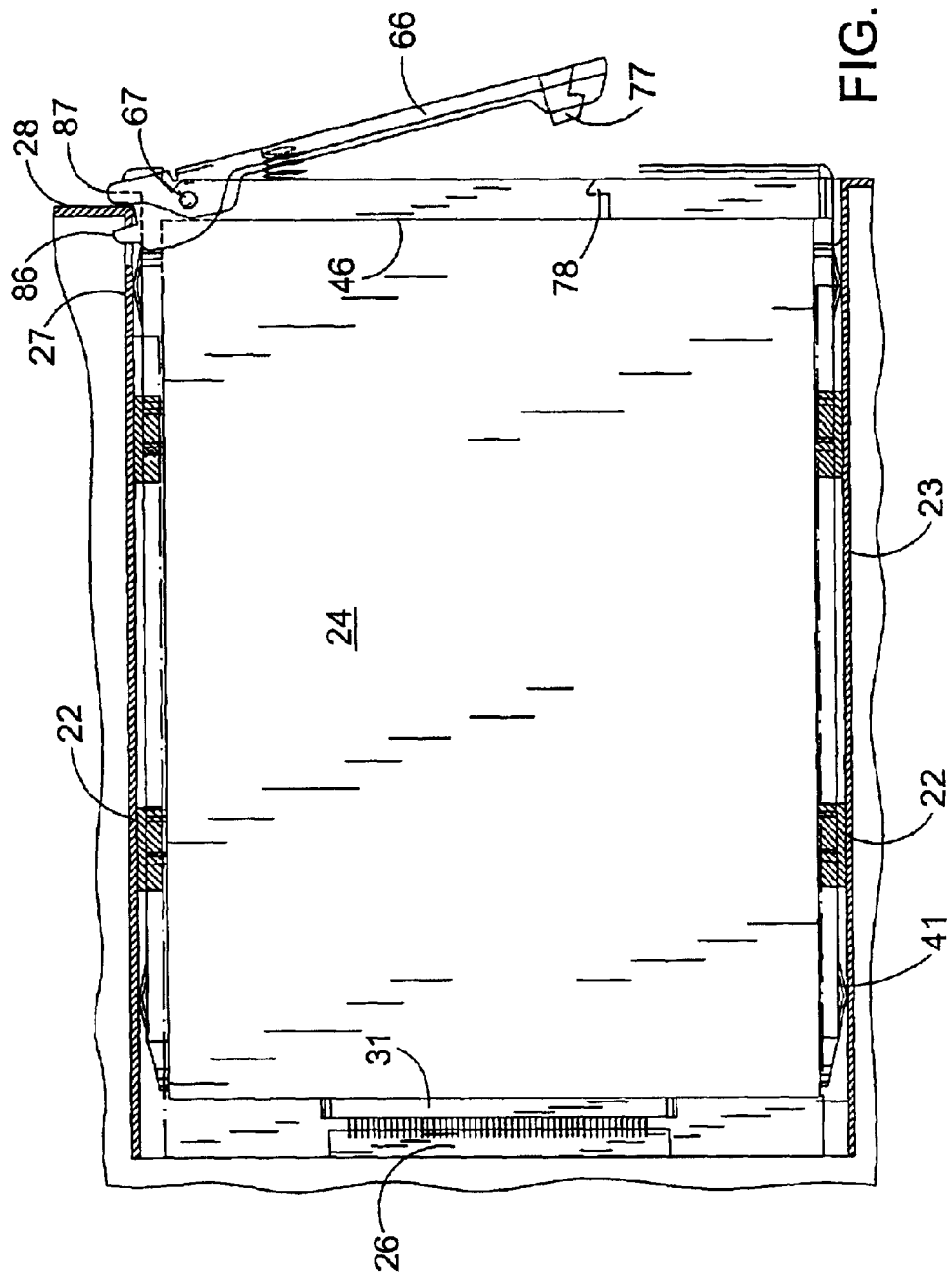
Figure 6C:
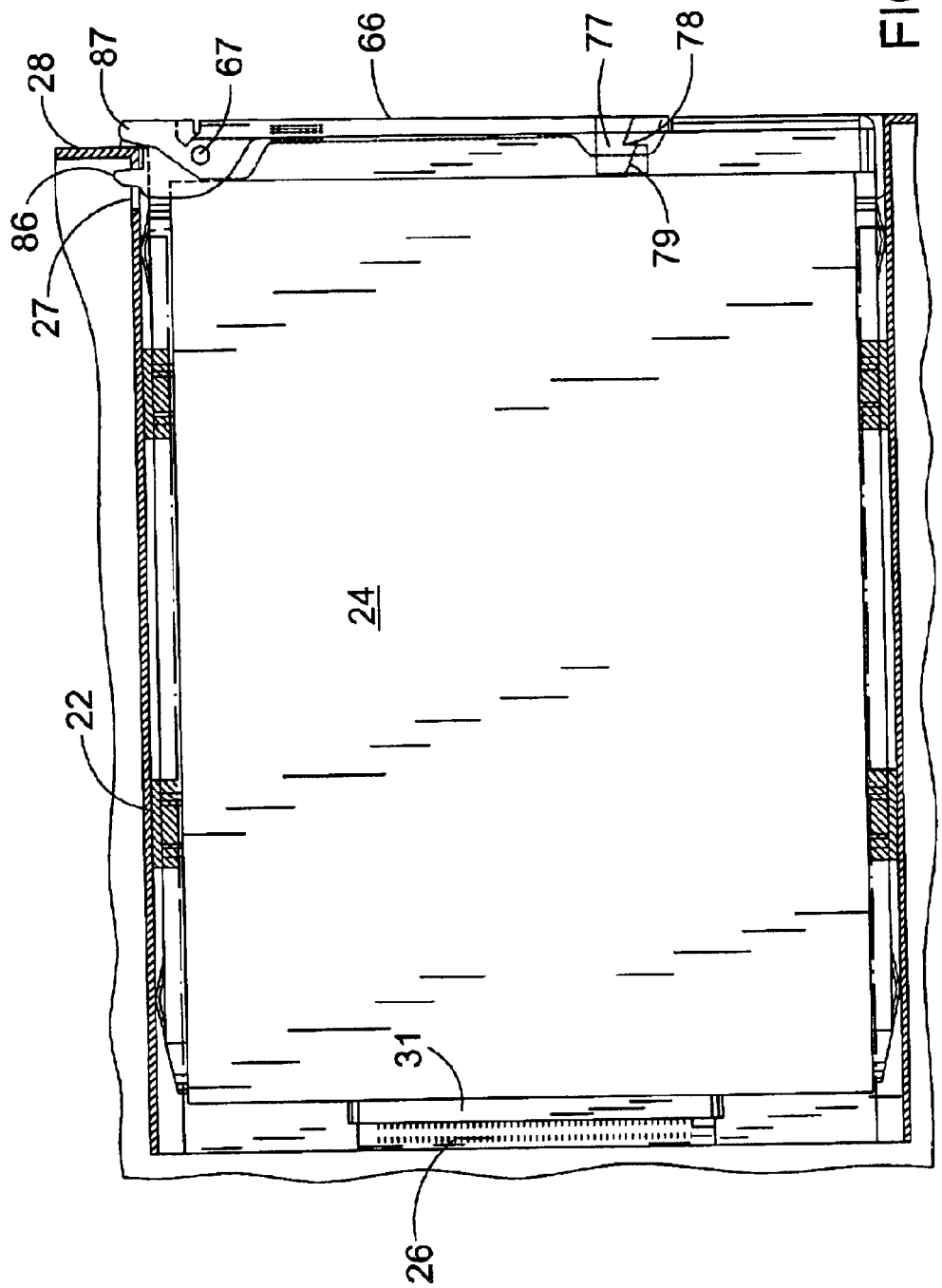
Figure 8:
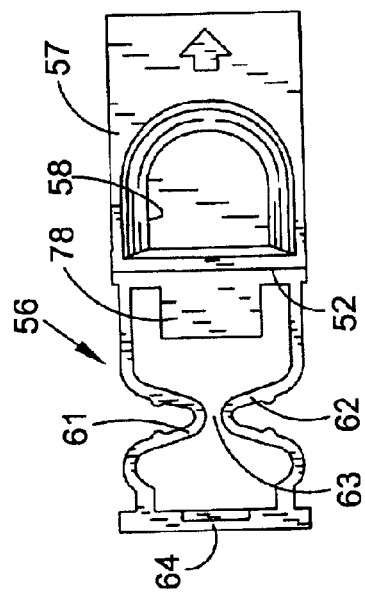
FIG. 8 is a front elevational view of the slide which is to fit into the crosspiece of the bracket.
Figure 9:
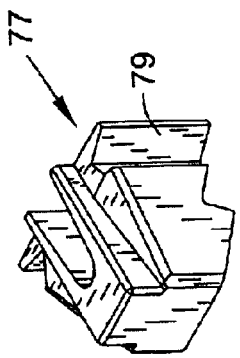
FIG. 9 is an enlarged perspective view of a hook attached to the handle.

In order to install the disk drive 24, the user first pushes the slide 57 to the right, allowing barb 78 to disengage from hook 77 of handle 66. Under the influence of coil spring 54, the handle 66 pivots fully outwardly about 45°. The user then positions the disk drive 24 so that its back is within the guides 23, and then slides the disk drive inwardly of chassis 21 until the points 82, 87 abut the chassis side flange 28 (FIG. 6A). At this point there is no electrical connection between the disk drive plug 31 and the socket 26. The user then pivots handle 66 closed, hook 77 being engaged by barb 78. Pivoting the handle 66 closed causes finger 86 to engage the margin of slot 27, to force drive 24 inward at a measured speed until sockets 26, 31 engage, and stop 52 prevents further inward movement of the drive 24 (FIG. 6C).

When the drive is to be removed, the user pushes slide 57 to the right so that hook 77 is disengaged from barb 78. Spring 54 causes handle 66 to open to about 15° until point 87 contacts flange 28, stopping swinging movement of handle 66 (FIG. 6B). At this point, electrical engagement of sockets 26, 31 is maintained since drive 24 has not been moved. The user then inserts a finger between handle 66 and crosspiece 46 and pulls outwardly to cause the handle 66 to swing outwardly to about 45° (FIG. 6A). This actions causes finger 87 to push against flange 28 and thus pull the drive 24 away from the chassis until sockets 26, 31 disengage (FIG. 6A). The user may then pull drive 24 outwardly out of guides 23. The handle 66 may be used to carry the disk drive, if desired.

During both installation and removal of the drive, the speed of engagement or disengagement of socket 26 with plug 31 is controlled by swinging movement of handle 66. When the handle 66 is in closed position, the drive is locked in proper position.

The foregoing descriptions of specific embodiments of the present invention have been presented for purposes of illustration and description. They are not intended to be exhaustive or to limit the invention to the precise forms disclosed, and obviously many modification and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents. For example, when the terms "vertical" or "horizontal" are used in the claims, they are to be understood to relate to the Figures as illustrated. However, the device may be turned at an angle to the horizontal or inverted with the quoted terms referring to the altered orientation.

What is claimed is:

1. A bracket for mounting a storage device in a chassis, comprising:
   two sides having opposing inner surfaces configured to face the storage device, wherein each of the two sides has a top surface and a bottom surface substantially perpendicular to the opposing inner surfaces, and wherein each of the two sides comprises a lengthwise split and at least one bulge on the top or bottom surface and aligned with the split, wherein the bulge is configured to resiliently engage a guide in the chassis; and
   a crosspiece connecting the two sides.

2. The bracket as recited in claim 1, wherein said at least one bulge on the top or bottom surface of each side comprises a bulge on both the top and bottom surfaces of each side aligned with each respective lengthwise split, wherein each bulge is configured to resiliently engage the guide in the chassis.

3. The bracket as recited in claim 1, further comprising a spring attached to an outward facing surface of each side, wherein the spring is configured to resiliently engage the guide in the chassis.

4. The bracket as recited in claim 3, further comprising a screw for attaching each spring to the respective side of the bracket and for attaching the respective side of the bracket to the storage device.

5. The bracket as recited in claim 4, wherein each spring and screw are electrically conductive and configured to establish a conductive path between the storage device and the chassis.

6. The bracket as recited in claim 1, further comprising a handle pivotally mounted to the crosspiece, wherein an end of the handle is configured to engage the chassis to secure the bracket in the chassis when the handle is pivoted inward toward the crosspiece, and wherein the end of the handle is configured to disengage the bracket from the chassis when the handle is pivoted outward from the crosspiece.

7. The bracket as recited in claim 6, wherein the end of the handle comprises two points and a notch between the two points, wherein the end of the handle is configured such that the notch engages a flange of the chassis when the handle is flush with the crosspiece, and such that one of the points operates to disengage the bracket from the chassis when the handle is pivoted out from the crosspiece.

8. The bracket as recited in claim 6, further comprising a latch mechanism configured to latch the handle in a closed position flush with the crosspiece.

9. The bracket as recited in claim 8, further comprising a spring biased between the crosspiece and the handle and configured to bias the handle out from the crosspiece when the latch mechanism is released.

10. The bracket as recited in claim 8, wherein the latch mechanism comprises a slide and a spring mounted to the crosspiece, wherein the slide is configured to reciprocally transverse across a portion of the crosspiece to release and close the latch mechanism, wherein the spring biases the slide to close the latch mechanism.

11. An apparatus, comprising:
   a storage device;
   a chassis having a guide for holding the storage device;
   a bracket connected to the storage device, wherein the bracket comprises two sides having opposing inner surfaces facing the storage device, wherein each of the two sides has a top surface and a bottom surface substantially perpendicular to the opposing inner surfaces, and wherein each of the two sides comprises a lengthwise split and at least one bulge on the top or bottom surface and aligned with the split, wherein the bulge is configured to resiliently engage the guide in the chassis.

12. The apparatus as recited in claim 11, wherein said at least one bulge on the top or bottom surface of each side of the bracket comprises a bulge on both the top and bottom surfaces of each side aligned with each respective lengthwise split, wherein each bulge is configured to resiliently engage the guide in the chassis.

13. The apparatus as recited in claim 11, further comprising a spring attached to an outward facing surface of each side of the bracket, wherein the spring is configured to resiliently engage the guide in the chassis.

14. The apparatus as recited in claim 11, further comprising a screw for attaching each spring to the respective side of the bracket and for attaching the respective side of the bracket to the storage device.

15. The apparatus as recited in claim 14, wherein each spring and screw are electrically conductive and configured to establish a conductive path between the storage device and the chassis.

16. The apparatus as recited in claim 11, wherein the bracket further comprises:
   a crosspiece connecting the two sides; and
   a handle pivotally mounted to the crosspiece, wherein an end of the handle is configured to engage the chassis to secure the bracket and storage device in the chassis when the handle is pivoted inward toward the crosspiece, and wherein the end of the handle is configured to disengage the bracket and storage device from the chassis when the handle is pivoted outward from the crosspiece.

17. The apparatus as recited in claim 16, wherein the end of the handle comprises two points and a notch between the two points, wherein the end of the handle is configured such that the notch engages a flange of the chassis when the handle is flush with the crosspiece, and such that one of the points operates to disengage the bracket from the chassis when the handle is pivoted out from the crosspiece.

18. The apparatus as recited in claim 16, wherein the bracket further comprises a latch mechanism configured to latch the handle in a closed position flush with the crosspiece.

19. The apparatus as recited in claim 18, wherein the bracket further comprises a spring biased between the crosspiece and the handle and configured to bias the handle out from the crosspiece when the latch mechanism is released.

20. The apparatus as recited in claim 18, wherein the latch mechanism comprises a slide and a spring mounted to the crosspiece, wherein the slide is configured to reciprocally transverse across a portion of the crosspiece to release and close the latch mechanism, wherein the spring biases the slide to close the latch mechanism.

21. The apparatus as recited in claim 16, wherein the storage device comprises a connector and the chassis comprises a socket configured to receive the storage device connector, wherein the end of said handle is configured to pull the bracket and storage device into the chassis as the handle is pivoted in toward the crosspiece so that the storage device connector engages the chassis socket at a controlled rate.

22. The apparatus as recited in claim 16, wherein the storage device comprises a connector and the chassis comprises a socket configured to receive the storage device connector, wherein the end of said handle is configured to pull the bracket and storage device out from the chassis as the handle is pivoted out from the crosspiece so that the storage device connector disengages the chassis socket at a controlled rate.

23. The apparatus as recited in claim 11, wherein the storage device comprises a disk drive.

24. An assembly, comprising:
a storage device; and
two sides of a bracket connected to the storage device, the two sides having opposing inner surfaces configured to face the storage device, wherein each of the two sides has a top surface and a bottom surface substantially perpendicular to the opposing inner surfaces, and wherein each of the two sides comprises a lengthwise split and at least one bulge on the top or bottom surface and aligned with the split, wherein the bulge is configured to resiliently engage a guide in a chassis configured to receive the assembly.

25. The assembly as recited in claim 24, wherein said at least one bulge on the top or bottom surface of each side of the bracket comprises a bulge on both the top and bottom surfaces of each side aligned with each respective lengthwise split, wherein each bulge is configured to resiliently engage the guide in the chassis.

26. The assembly as recited in claim 24, further comprising a spring attached to an outward facing surface of each side of the bracket, wherein the spring is configured to resiliently engage the guide in the chassis.

27. The assembly as recited in claim 26, further comprising a screw for attaching each spring to the respective side of the bracket and for attaching the respective side of the bracket to the storage device.

28. The assembly as recited in claim 26, wherein each spring and screw are electrically conductive and configured to establish a conductive path between the storage device and the chassis.

29. The assembly as recited in claim 24, further comprising:
a crosspiece connecting the two sides of the bracket; and
a handle pivotally mounted to the crosspiece, wherein an end of the handle is configured to engage the chassis to secure the bracket and the storage device in the chassis when the handle is pivoted inward toward the crosspiece, and wherein the end of the handle is configured to disengage the bracket and the storage device from the chassis when the handle is pivoted outward from the crosspiece.

30. The assembly as recited in claim 29, wherein the end of the handle comprises two points and a notch between the two points, wherein the end of the handle is configured such that the notch engages a flange of the chassis when the handle is flush with the crosspiece, and such that one of the points operates to disengage the bracket and the storage device from the chassis when the handle is pivoted out from the crosspiece.

31. The assembly as recited in claim 29, further comprising a latch mechanism configured to latch the handle in a closed position flush with the crosspiece.

32. The assembly as recited in claim 31, further comprising a spring biased between the crosspiece and the handle and configured to bias the handle out from the crosspiece when the latch mechanism is released.

33. The assembly as recited in claim 31, wherein the latch mechanism comprises a slide and a spring mounted to the crosspiece, wherein the slide is configured to reciprocally transverse across a portion of the crosspiece to release and close the latch mechanism, wherein the spring biases the slide to close the latch mechanism.

34. A bracket for mounting a storage device in a chassis, comprising:
two sides;
a crosspiece connecting the two sides; and
a handle pivotally mounted to the crosspiece, wherein an end of the handle is configured to engage the chassis to secure the bracket in the chassis when the handle is pivoted inward toward the crosspiece, and wherein the end of the handle is configured to disengage the bracket from the chassis when the handle is pivoted outward from the crosspiece.

35. The bracket as recited in claim 34, wherein the end of the handle comprises two points and a notch between the two points, wherein the end of the handle is configured such that the notch engages a flange of the chassis when the handle is flush with the crosspiece, and such that one of the points operates to disengage the bracket from the chassis when the handle is pivoted out from the crosspiece.

36. The bracket as recited in claim 34, further comprising a latch mechanism configured to latch the handle in a closed position flush with the crosspiece.

37. The bracket as recited in claim 36, further comprising a spring biased between the crosspiece and the handle and configured to bias the handle out from the crosspiece when the latch mechanism is released.

38. The bracket as recited in claim 36, wherein the latch mechanism comprises a slide and a spring mounted to the crosspiece, wherein the slide is configured to reciprocally transverse across a portion of the crosspiece to release and close the latch mechanism, wherein the spring biases the slide to close the latch mechanism.

39. The bracket as recited in claim 34, wherein the two sides have opposing inner surfaces configured to face the storage device, wherein each of the two sides has a top surface and a bottom surface substantially perpendicular to the opposing inner surfaces, and wherein each of the two sides comprises a lengthwise split and at least one bulge on the top or bottom surface and aligned with the split, wherein the bulge is configured to resiliently engage a guide in the chassis.

40. The bracket as recited in claim 39, wherein said at least one bulge on the top or bottom surface of each side comprises a bulge on both the top and bottom surfaces of each side aligned with each respective lengthwise split, wherein each bulge is configured to resiliently engage the guide in the chassis.

41. The bracket as recited in claim 39, further comprising a spring attached to an outward facing surface of each side, wherein the spring is configured to resiliently engage the guide in the chassis.

42. The bracket as recited in claim 41, further comprising a screw for attaching each spring to the respective side of the bracket and for attaching the respective side of the bracket to the storage device.

43. The bracket as recited in claim 42, wherein each spring and screw are electrically conductive and configured to establish a conductive path between the storage device and the chassis.

44. An apparatus, comprising:
a storage device;
a chassis having a guide for holding the storage device;
a bracket connected to the storage device, the bracket comprising:

two sides;
a crosspiece connecting the two sides; and
a handle pivotally mounted to the crosspiece, wherein an end of the handle is configured to engage the chassis to secure the bracket and storage device in the chassis when the handle is pivoted inward toward the crosspiece, and wherein the end of the handle is configured to disengage the bracket and storage device from the chassis when the handle is pivoted outward from the crosspiece.

45. The apparatus as recited in claim 44, wherein the end of the handle comprises two points and a notch between the two points, wherein the end of the handle is configured such that the notch engages a flange of the chassis when the handle is flush with the crosspiece, and such that one of the points operates to disengage the bracket from the chassis when the handle is pivoted out from the crosspiece.

46. The apparatus as recited in claim 44, wherein the bracket further comprises a latch mechanism configured to latch the handle in a closed position flush with the crosspiece.

47. The apparatus as recited in claim 46, wherein the bracket further comprises a spring biased between the crosspiece and the handle and configured to bias the handle out from the crosspiece when the latch mechanism is released.

48. The apparatus as recited in claim 46, wherein the latch mechanism comprises a slide and a spring mounted to the crosspiece, wherein the slide is configured to reciprocally transverse across a portion of the crosspiece to release and close the latch mechanism, wherein the spring biases the slide to close the latch mechanism.

49. The apparatus as recited in claim 44, wherein the storage device comprises a connector and the chassis comprises a socket configured to receive the storage device connector, wherein the end of said handle is configured to pull the bracket and storage device into the chassis as the handle is pivoted in toward the crosspiece so that the storage device connector engages the chassis socket at a controlled rate.

50. The apparatus as recited in claim 44, wherein the storage device comprises a connector and the chassis comprises a socket configured to receive the storage device connector, wherein the end of said handle is configured to pull the bracket and storage device out from the chassis as the handle is pivoted out from the crosspiece so that the storage device connector disengages the chassis socket at a controlled rate.

51. The apparatus as recited in claim 44, wherein the storage device comprises a disk drive.

52. The apparatus as recited in claim 44, wherein the two sides of the bracket have opposing inner surfaces facing the storage device, wherein each of the two sides has a top surface and a bottom surface substantially perpendicular to the opposing inner surfaces, and wherein each of the two sides comprises a lengthwise split and at least one bulge on the top or bottom surface and aligned with the split, wherein the bulge is configured to resiliently engage the guide in the chassis.

53. The apparatus as recited in claim 52, wherein said at least one bulge on the top or bottom surface of each side of the bracket comprises a bulge on both the top and bottom surfaces of each side aligned with each respective lengthwise split, wherein each bulge is configured to resiliently engage the guide in the chassis.

54. The apparatus as recited in claim 52, further comprising a spring attached to an outward facing surface of each side of the bracket, wherein the spring is configured to resiliently engage the guide in the chassis.

55. The apparatus as recited in claim 54, further comprising a screw for attaching each spring to the respective side of the bracket and for attaching the respective side of the bracket to the storage device.

56. The apparatus as recited in claim 55, wherein each spring and screw are electrically conductive and configured to establish a conductive path between the storage device and the chassis.

57. An assembly, comprising:
a storage device;
two sides of a bracket connected to the storage device;
a crosspiece connecting the two sides of the bracket; and
a handle pivotally mounted to the crosspiece, wherein an end of the handle is configured to engage a chassis to secure the bracket and the storage device in the chassis when the handle is pivoted inward toward the crosspiece, and wherein the end of the handle is configured to disengage the bracket and the storage device from the chassis when the handle is pivoted outward from the crosspiece.

58. The assembly as recited in claim 57, wherein the end of the handle comprises two points and a notch between the two points, wherein the end of the handle is configured such that the notch engages a flange of the chassis when the handle is flush with the crosspiece, and such that one of the points operates to disengage the bracket and the storage device from the chassis when the handle is pivoted out from the crosspiece.

59. The assembly as recited in claim 57, further comprising a latch mechanism configured to latch the handle in a closed position flush with the crosspiece.

60. The assembly as recited in claim 59, further comprising a spring biased between the crosspiece and the handle and configured to bias the handle out from the crosspiece when the latch mechanism is released.

61. The assembly as recited in claim 59, wherein the latch mechanism comprises a slide and a spring mounted to the crosspiece, wherein the slide is configured to reciprocally transverse across a portion of the crosspiece to release and close the latch mechanism, wherein the spring biases the slide to close the latch mechanism.

62. The assembly as recited in claim 57, wherein the two sides of the bracket have opposing inner surfaces configured to face the storage device, wherein each of the two sides has a top surface and a bottom surface substantially perpendicular to the opposing inner surfaces, and wherein each of the two sides comprises a lengthwise split and at least one bulge on the top or bottom surface and aligned with the split, wherein the bulge is configured to resiliently engage a guide in a chassis configured to receive the assembly.

63. The assembly as recited in claim 62, wherein said at least one bulge on the top or bottom surface of each side of the bracket comprises a bulge on both the top and bottom surfaces of each side aligned with each respective lengthwise split, wherein each bulge is configured to resiliently engage the guide in the chassis.

64. The assembly as recited in claim 62, further comprising a spring attached to an outward facing surface of each side of the bracket, wherein the spring is configured to resiliently engage the guide in the chassis.

65. The assembly as recited in claim 64, further comprising a screw for attaching each spring to the respective side of the bracket and for attaching the respective side of the bracket to the storage device.

66. The assembly as recited in claim 64, wherein each spring and screw are electrically conductive and configured to establish a conductive path between the storage device and the chassis.

67. The assembly as recited in claim 57, wherein the storage device comprises a disk drive.

68. In combination, a chassis having spaced sides, said sides being formed with guides spaced apart to guide a disk drive in a direction parallel to said sides into said chassis, at least one said side having a front edge and a slot spaced inward from said front edge;

a disk drive having a drive front, rear, drive sides, top and bottom and a first connector for insertion into the chassis, wherein the sides of the chassis are formed with guides and wherein the chassis comprises a second connector engageable with said first connector when said drive is inserted through said guides into said chassis;

a bracket comprising a pair of bracket sides attached to said drive sides and a crosspiece across said drive front;

a handle pivotally mounted to said crosspiece inward from a first end of said crosspiece for outward pivotal movement;

first and second points on said handle extending outward relative to said first end, said first point lying approximately on a plane including and parallel to said handle, said second point being spaced rearward relative to said first point;

said first and second points being separated by a notch;

said handle being pivotally moveable between a first position parallel to said crosspiece, a second position at a first angle to said crosspiece and a third position at a second angle to said crosspiece greater than said first angle, said first and second connectors being in engagement when said handle is in said first position;

said first point engaging said front edge when said handle is in said second position, said first and second connectors being in engagement when said handle is in said second position;

said first point engaging said front edge to pull said bracket outwardly of said chassis as said handle is moved outwardly from said second to third positions and to disengage said first and second connectors.

69. The combination as recited in claim 68, further comprising first and second latch elements on said handle and said crosspiece respectively, to hold said handle in said first position.

70. The combination as recited in claim 69, wherein one said latch element is resiliently biased into engagement with the other said latch element.

71. The combination as recited in claim 69, further comprising a slide mounted in said crosspiece for horizontal transverse reciprocation and a spring on said slide fixed to said crosspiece, said second latch element moving with said slide, said spring biasing said second latch element into engagement with said first latch element.

72. The combination as recited in claim 68, further comprising a spring biasing said handle from said first to said second position.

* * * * *

UNITED STATES PATENT AND TRADEMARK OFFICE
CERTIFICATE OF CORRECTION

PATENT NO.    : 6,798,650 B2
DATED         : September 28, 2004
INVENTOR(S)   : Reznikov et al.

It is certified that error appears in the above-identified patent and that said Letters Patent is hereby corrected as shown below:

Column 6,
Line 18, please delete "11" insert -- 13 -- in place thereof.

Signed and Sealed this

Fifteenth Day of February, 2005

JON W. DUDAS
*Director of the United States Patent and Trademark Office*